US010290790B1

(12) United States Patent
Fan

(10) Patent No.: US 10,290,790 B1
(45) Date of Patent: May 14, 2019

(54) HIGH THERMAL CONDUCTIVITY QUANTUM DOT LIGHT EMITTING DIODE

(71) Applicant: HUIZHOU CHINA STAR OPTOELECTRONICS TECHNOLOGY CO., LTD., Huizhou Guangdong (CN)

(72) Inventor: Yong Fan, Huizhou Guangdong (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 0 days.

(21) Appl. No.: 16/010,062

(22) Filed: Jun. 15, 2018

Related U.S. Application Data

(63) Continuation of application No. PCT/CN2018/079004, filed on Mar. 14, 2018.

(30) Foreign Application Priority Data

Jan. 31, 2018 (CN) .......................... 2018 1 0096318

(51) Int. Cl.

| | |
|---|---|
| ***H01L 33/50*** | (2010.01) |
| ***H01L 33/64*** | (2010.01) |
| ***H01L 33/56*** | (2010.01) |
| ***C09K 11/02*** | (2006.01) |
| ***C09K 11/61*** | (2006.01) |
| ***C09K 5/14*** | (2006.01) |
| ***H01L 51/52*** | (2006.01) |
| *B82Y 20/00* | (2011.01) |

(52) U.S. Cl.
CPC .............. *H01L 33/644* (2013.01); *C09K 5/14* (2013.01); *C09K 11/025* (2013.01); *C09K 11/617* (2013.01); *H01L 33/502* (2013.01); *H01L 33/504* (2013.01); *H01L 33/56* (2013.01); *H01L 51/524* (2013.01); *B82Y 20/00* (2013.01); *H01L 2933/0083* (2013.01)

(58) Field of Classification Search
None
See application file for complete search history.

(56) References Cited

U.S. PATENT DOCUMENTS

2017/0005238 A1* 1/2017 Hung ...................... H01L 33/50
2017/0373264 A1* 12/2017 Liu ..................... H01L 51/5012

* cited by examiner

*Primary Examiner* — Cheung Lee
(74) *Attorney, Agent, or Firm* — Hauptman Ham, LLP

(57) ABSTRACT

Provided is a high thermal conductivity quantum dot light emitting diode, comprising a bracket, an light emitting diode chip fixed on the bracket and connected with the bracket and a silicon colloidal body located on an upper side of the light emitting diode chip; wherein an inorganic film package layer is wrapped outside the silicon colloidal body, and the inorganic thin film package layer fixes the silicon colloidal body and the light emitting diode chip; wherein a plurality of quantum dots and a plurality of high thermal conductivity parts are dispersed in the silicon colloidal body. The issue that the quantum dots are damaged due to the high temperature or the water and oxygen environment is solved by using the mixture of high thermal conductivity materials and quantum dots and the enclosed structure.

10 Claims, 2 Drawing Sheets 341 342 343 344 36 35 34 33 32 31

HIGH THERMAL CONDUCTIVITY QUANTUM DOT LIGHT EMITTING DIODE

CROSS-REFERENCE TO RELATED APPLICATION

This application is a continuing application of PCT Patent Application No. PCT/CN2018/079004 entitled "High thermal conductivity quantum dot light emitting diode", filed on Mar. 14, 2018, which claims priority to Chinese Patent Application No. 201810096318.2, filed on Jan. 31, 2018, both of which are hereby incorporated in its entireties by reference.

FIELD OF THE INVENTION

The present invention relates to a light emitting diode field, and more particularly to a high thermal conductivity quantum dot light emitting diode.

BACKGROUND OF THE INVENTION

Due to the narrow emission peaks of quantum dots, the emission wavelength can vary with the size conditions and is currently widely used in the backlight products. However, as the quantum dots are exposed to the water and oxygen environment, there is an irreversible and rapid decrease in the fluorescence efficiency. The package of the quantum dots requires good isolation from water and oxygen. At present, PET sheets with barrier films are configured on and beneath the quantum dot sheet. In order to make the quantum dot sheet have stable optical properties and service life, the oxygen barrier capacity of the barrier films needs to reach <10−1 cc/m^2·day, and the water permeability also needs to reach <10−1 g/m^2·day. In addition, because the quantum dots are sensitive to temperature, once the temperature increases, the wavelength of the quantum dots will have a red shift, and the luminous efficiency will also decrease.

As shown in FIG. 1, the conventional light emitting diode utilizes a metal bracket 11 and a plastic bracket 12. The light emitting diode chip 13 is fixed on the metal bracket 11 and connected to the metal bracket 11 with the gold wires 14. The phosphor and silicone gel 15 are packaged on the metal bracket 11 and the plastic bracket 12 with the packaging glue 16. Since the oxygen permeability and water permeability of the plastic bracket 12 and the packaging glue 16 do not meet the requirements of the quantum dot working environment, and the thermal conductivities of the plastic bracket 12 and the packaging glue 16 are lower. It causes the temperature of the quantum dots to increase, and the quantum dots may decrease in luminous efficiency when the temperature increases.

SUMMARY OF THE INVENTION

For solving the aforesaid technical issue, the present invention provides a high thermal conductivity quantum dot light emitting diode.

The present invention provides a high thermal conductivity quantum dot light emitting diode, comprising a bracket, an light emitting diode chip fixed on the bracket and connected with the bracket and a silicon colloidal body located on an upper side of the light emitting diode chip; wherein an inorganic thin film package layer is wrapped outside the silicon colloidal body, and the inorganic thin film package layer fixes the silicon colloidal body and the light emitting diode chip;

wherein a plurality of quantum dots and a plurality of high thermal conductivity parts are dispersed in the silicon colloidal body.

Furthermore, the plurality of high thermal conductivity parts are at least one of nano pipelines, graphene sheets and molybdenum dioxide particles.

Furthermore, the silicon colloidal body further comprises a fluorosilicate K2SiF6:Mn4 and red phosphor, and the quantum dots are green quantum dots.

Furthermore, the high thermal conductivity quantum dot light emitting diode further comprises a low refractive optical layer, wherein the low refractive optical layer is arranged outside the inorganic thin film package layer and surrounds at least a portion of the inorganic thin film package layer.

Furthermore, the inorganic thin film package layer is disposed on the bracket to form an enclosed structure with the bracket, and the silicon colloidal body is disposed in the enclosed structure.

Furthermore, the inorganic thin film package layer is disposed on the bracket and surrounds to form an enclosed structure, and the silicon colloidal body is disposed in the enclosed structure.

Furthermore, a thickness of the inorganic thin film package layer is 20 nm to 200 nm.

Furthermore, the inorganic thin film package layer is prepared by atomic layer thin film deposition.

Furthermore, the inorganic thin film package layer is a single-layered structure, and a composition material of the single-layered structure comprises any one of aluminum oxide, zirconium oxide and titanium dioxide.

Furthermore, the inorganic thin film package layer is a multilayer structure, and a composition material of each layer of the multilayer structure is one of aluminum oxide, zirconium oxide and titanium dioxide.

Furthermore, composition materials of adjacent layers in the multilayer structure of the inorganic thin film package layer are different.

The embodiment of the present invention has benefits below: by using the mixture of the quantum dots with the high thermal conductivity materials and the isolation of water and oxygen environment, the quantum dots high luminous efficiency is maintained, and the red phosphor and green quantum dots are utilized at the same time to reduce the usage of the quantum dots to reduce environmental pollution. Thus, the quantum dot luminous efficiency issue is solved to avoid the pollution of the environment as possible.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The key of this patent application is to ensure that the temperature of the quantum dots does not increase due to the heat dissipation of the quantum dots with the high thermal conductivity material. The quantum dots with a low oxygen permeability and a low water permeability are provided with the inorganic thin film package layer to ensure the luminous efficiency of the quantum dots. The red phosphor replaces the red quantum dots to reduce the pollution. The specific implementation of the system will be further described below with reference to the accompanying drawings and embodiments.

An embodiment of a high thermal conductivity quantum dot light emitting diode provided by the present invention will be described in detail below.

Figure 1:
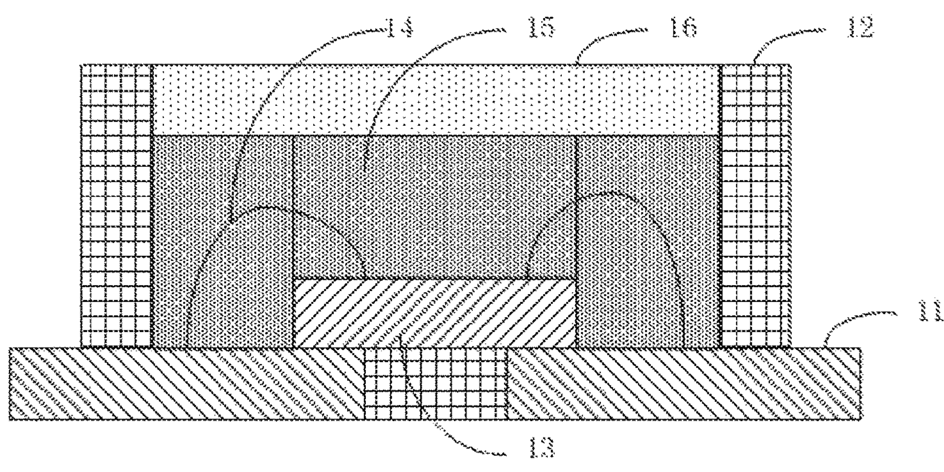
FIG. 1 is a structural diagram of a conventional light emitting diode package provided by the prior art.
Figure 2:
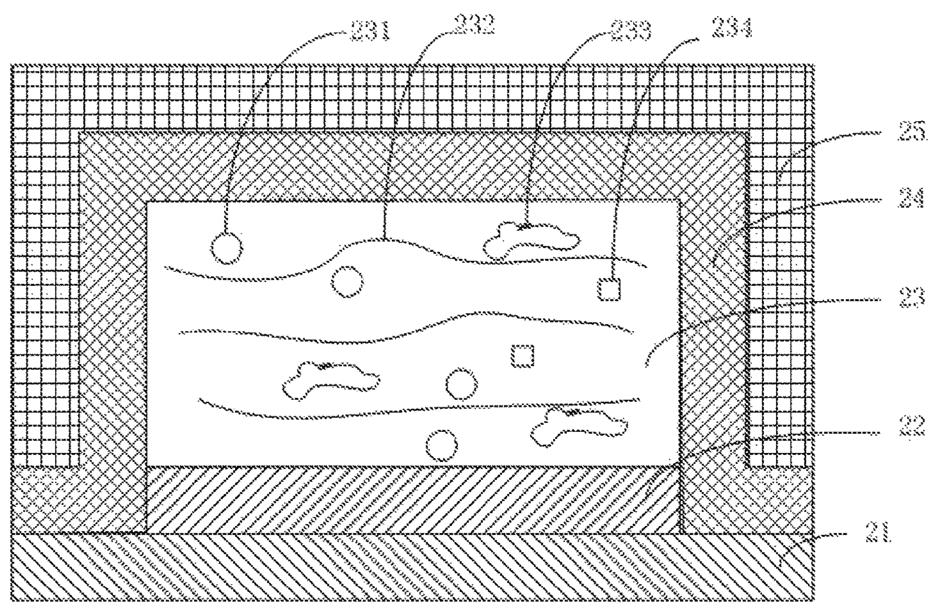
FIG. 2 is a structural diagram of a quantum dot light emitting diode provided by the embodiment of the present invention.

The embodiment of the present invention provides a high thermal conductivity quantum dot light emitting diode. As shown in FIG. 2, the high thermal conductivity quantum dot light emitting diode comprises a bracket 21, an light emitting diode chip 22 fixed on the bracket 21 and connected with the bracket 21 and a silicon colloidal body 23 located on an upper side of the light emitting diode chip; wherein an inorganic thin film package layer 24 is wrapped outside the silicon colloidal body 23, and the inorganic thin film package layer fixes the light emitting diode chip 22 and the silicon colloidal body 23 to water and oxygen for silicon colloidal body 23;

wherein a plurality of quantum dots 231 and a plurality of high thermal conductivity parts are dispersed in the silicon colloidal body 23, the high thermal conductivity parts are at least one of nano pipelines 232, graphene sheets 233 and molybdenum dioxide particles 234, and the combination of the graphene sheets and the nano pipelines or the combination of the molybdenum dioxide particles and the nano pipelines is better, or all of three can be used, together, and the nano pipelines include silver nano pipelines and carbon nano pipelines; the method of arranging the quantum dots and the high thermal conductivity parts in the silicon colloidal body is to dope the quantum dots and the high thermal conductivity parts in silicon particles and to cure them by heating, and the purpose of doping the high thermal conductivity parts is to solve the heat dissipation issue and to avoid the high temperature leading to quantum dot failure.

The quantum dots can be quantum dots stimulated to emit green light and quantum dots stimulated to emit red light, a mixture of quantum dots stimulated to emit green light and quantum dots stimulated to emit red light, or a mixture of quantum dots and general phosphor. The quantum dot materials comprise any one of CdS, CdSe, ZnS, ZnSe, InP, CulnS, CH3NH3 PbBr3, and CSPbBr3. Although quantum dots have good luminescence, quantum dots contain toxic and harmful chemical elements, such as cadmium and lead. To limit quantum dot usage, a combination of a fluorosilicate K2SiF6:Mn4 and red phosphor can be used to replace the red quantum dots with the red phosphor to lower the usage amount of the quantum dots to reduce the use of toxic and harmful ingredients.

In this embodiment, the inorganic thin film package layer is disposed on the bracket and forms an enclosed structure with the bracket, together. The purpose of disposing the silicon colloidal body inside is to isolate the quantum dots from the external water and oxygen, so as to prevent the entry of water and oxygen into the quantum dots. For achieving the effect of isolating water and oxygen in advance, the outer side wall of the quantum dot package abuts against the inner cavity wall of the enclosed structure. It means that the quantum dot package and the inorganic thin film package layer are in close contact. One purpose is to minimize the size of the quantum dot light emitting diode. Another purpose is to leave no space for water and oxygen.

A thickness of the inorganic thin film package layer is limited within 20 nm to 200 nm. The thickness of the inorganic thin film package layer which is too small can cause that the effect of isolating water and oxygen cannot reach the requirements. The overlarge thickness of the inorganic thin film package layer affects light transmission, and even results in too high refractive index of light to cause the reduced light emitting effect.

In order to better achieve the effect of isolating water and oxygen, the embodiment of the present invention utilizes an atomic layer thin film deposition to prepare an inorganic thin film package layer. The atomic layer thin film deposition can improve the film formation non-uniformity and film cracking due to the unevenness of the film formation in comparison with the sputtering deposition. The material for preparing the inorganic thin film package layer is generally selected from at least one or more of aluminum oxide, zirconium oxide and titanium dioxide. If the inorganic thin film package layer is a single-layer structure, any one of the above materials is selected. If the inorganic thin film package layer is a multilayer structure, any one of preparation materials may be selected or multiple preparation materials may be used. In the case of using a plurality of materials, layers of different preparation materials are used, alternately. Namely, the composition materials of adjacent layers in the multilayer structure are different to achieve better isolation of water and oxygen. For instance, a total of 8 layers of an inorganic thin film package layer composed of aluminum oxide and zirconium oxide are used, then 4 layers of aluminum oxide and 4 layers of zirconium oxide are disposed alternately.

The effect of isolating water and oxygen can be well realized by arranging the inorganic thin film package layer 24. Meanwhile, for ensuring luminous efficiency, a low refractive optical layer 25 is disposed outside the inorganic thin film package layer 24. The low refractive optical layer 25 surrounds at least a portion of the inorganic thin film package layer 24 and the low refractive optical layer 25 is made of an organic material.

Figure 3:
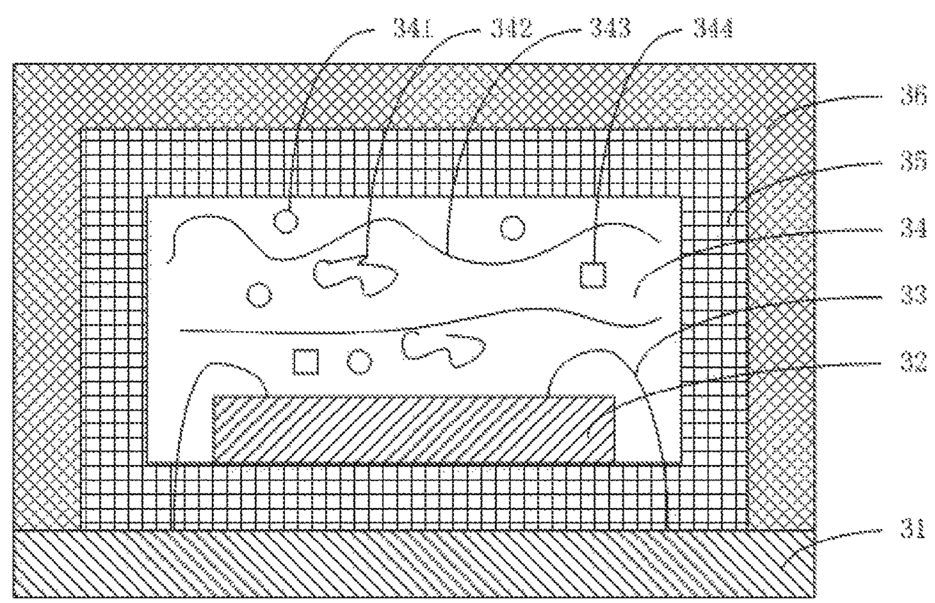
FIG. 3 is a structural diagram of a quantum dot light emitting diode provided by another embodiment of the present invention.

Another embodiment of the present invention provides a high thermal conductivity quantum dot light emitting diode. As shown in FIG. 3, the high thermal conductivity quantum dot light emitting diode comprises a bracket 31, an light emitting diode chip 32 fixed on the bracket 31, gold wires 33 connecting bracket 31 and the light emitting diode chip, a silicon colloidal body 34 located on an upper side of the light emitting diode chip 32 and an inorganic thin film package layer 35, fixing the light emitting diode chip 32 and the silicon colloidal body 34; wherein the inorganic thin film package layer 35 surrounds to form an en closed structure, the silicon colloidal body 34 is disposed in the enclosed structure so that the silicon colloidal body 34 is isolated from the outside. Here, one end of the gold wire 33 passes through the inorganic thin film package layer 35 and is connected to the bracket 31, and the other end is connected to the light emitting diode chip 32.

The silicon colloidal body 34 comprises quantum dots 231 and a high thermal conductivity material. The high thermal conductivity material can be any one of graphene sheets 342, nano pipelines 343 and molybdenum dioxide particles 344, the combination of the graphene sheets and the nano pipelines or the combination of the molybdenum dioxide particles and the nano pipelines. Certainly, all of the aforesaid graphene sheets, molybdenum dioxide particles and nano pipelines can be used, together for the high thermal conductivity material. The nano pipelines include silver nano pipelines and carbon nano pipelines. With the addition of the high thermal conductivity material, the quantum dot heat dissipation performance is greatly increased, which effectively solves the problem that quantum dots decrease in efficiency with increasing temperature.

Although quantum dots have good luminescence, quantum dots contain toxic and harmful chemical elements, such as cadmium and lead. To limit quantum dot usage, a combination of a fluorosilicate K2SiF6:Mn4 and red phosphor can be used to replace the red quantum dots with the red phosphor to lower the usage amount of the quantum dots to reduce the use of toxic and harmful ingredients.

In this embodiment, the inorganic thin film package layer is disposed on the bracket and forms an enclosed structure with itself. The purpose of disposing the silicon colloidal body inside is to isolate the quantum dots from the external water and oxygen, so as to prevent the entry of water and oxygen into the quantum dots. For achieving the effect of isolating water and oxygen in advance, the outer side wall of the silicon colloidal body abuts against the inner cavity wall of the enclosed structure. It means that the silicon colloidal body and the inorganic thin film package layer are in close contact. One purpose is to minimize the size of the quantum dot light emitting diode. Another purpose is to leave no space for water and oxygen.

A thickness of the inorganic thin film package layer is limited within 20 nm to 200 nm. The thickness of the inorganic thin film package layer which is too small can cause that the effect of isolating water and oxygen cannot reach the requirements. The overlarge thickness of the inorganic thin film package layer affects light transmission, and even results in too high refractive index of light to cause the reduced light emitting effect.

In order to better achieve the effect of isolating water and oxygen, the embodiment of the present invention utilizes an atomic layer thin film deposition to prepare an inorganic thin film package layer. The atomic layer thin film deposition can improve the film formation non-uniformity and film cracking due to the unevenness of the film formation in comparison with the sputtering deposition. The material for preparing the inorganic thin film package layer is generally selected from at least one or more of aluminum oxide, zirconium oxide and titanium dioxide. If the inorganic thin film package layer is a single-layer structure, only one of preparation materials will be enough. If the inorganic thin film package layer is a multilayer structure, any one of preparation materials may be selected or multiple preparation materials may be used. For instance, a total of 8 layers of an inorganic thin film package layer composed of aluminum oxide and zirconium oxide are used, then 4 layers of aluminum oxide and 4 layers of zirconium oxide are disposed alternately.

The effect of isolating water and oxygen can be well realized by arranging the inorganic thin film package layer. Meanwhile, for ensuring luminous efficiency, a low refractive optical layer is disposed outside the inorganic thin film package layer. The low refractive optical layer surrounds the inorganic thin film package layer and is made of an organic material.

It is understandable in practical to the person who is skilled in the art that all or portion of the processes in the method according to the aforesaid embodiment can be accomplished with the computer program to instruct the related hardwares. The program can be stored in a readable storage medium if the computer. As the program is executed, the processes of the embodiments in the aforesaid respective methods can be included. The storage medium can be a hardisk, an optical disc, a Read-Only Memory (ROM) or a Random Access Memory (RAM).

The above content with the specific preferred embodiments of the present invention is further made to the detailed description, the specific embodiments of the present invention should not be considered limited to these descriptions. Those of ordinary skill in the art for the present invention, without departing from the spirit of the present invention, can make various simple deduction or replacement, should be deemed to belong to the scope of the present invention.

What is claimed is:

1. A high thermal conductivity quantum dot light emitting diode, comprising a bracket, an light emitting diode chip fixed on the bracket and connected with the bracket and a silicon colloidal body located on an upper side of the light emitting diode chip; wherein an inorganic thin film package layer is wrapped outside the silicon colloidal body, and the inorganic thin film package layer fixes the silicon colloidal body and the light emitting diode chip;

wherein a plurality of quantum dots and a plurality of high thermal conductivity parts are dispersed in the silicon colloidal body.

2. The high thermal conductivity quantum dot light emitting diode according to claim 1, wherein the plurality of high thermal conductivity parts are at least one of nano pipelines, graphene sheets and molybdenum dioxide particles.

3. The high thermal conductivity quantum dot light emitting diode according to claim 2, wherein the silicon colloidal body further comprises a fluorosilicate $K_2SiF_6$:$Mn_4$ and red phosphor, and the quantum dots are green quantum dots.

4. The high thermal conductivity quantum dot light emitting diode according to claim 3, further comprising a low refractive optical layer, wherein the low refractive optical layer is arranged outside the inorganic thin film package layer and surrounds at least a portion of the inorganic thin film package layer.

5. The high thermal conductivity quantum dot light emitting diode according to claim 4, wherein the inorganic thin film package layer is disposed on the bracket to form an enclosed structure with the bracket, and the silicon colloidal body is disposed in the enclosed structure.

6. The high thermal conductivity quantum dot light emitting diode according to claim 4, wherein the inorganic thin film package layer is disposed on the bracket and surrounds to form an enclosed structure, and the silicon colloidal body is disposed in the enclosed structure.

7. The high thermal conductivity quantum dot light emitting diode according to claim 1, wherein the inorganic thin film package layer is prepared by atomic layer thin film deposition, and a thickness of the inorganic thin film package layer is 20 nm to 200 nm.

8. The high thermal conductivity quantum dot light emitting diode according to claim 1, wherein the inorganic thin film package layer is a single-layered structure, and a composition material of the single-layered structure comprises any one of aluminum oxide, zirconium oxide and titanium dioxide.

9. The high thermal conductivity quantum dot light emitting diode according to claim 1, wherein the inorganic thin film package layer is a multilayer structure, and a composition material of each layer of the multilayer structure is one of aluminum oxide, zirconium oxide and titanium dioxide.

10. The high thermal conductivity quantum dot light emitting diode according to claim 9, wherein composition materials of adjacent layers in the multilayer structure of the inorganic thin film package layer are different.

* * * * *